United States Patent [19]
Malhi

[11] Patent Number: 5,326,711
[45] Date of Patent: Jul. 5, 1994

[54] HIGH PERFORMANCE HIGH VOLTAGE VERTICAL TRANSISTOR AND METHOD OF FABRICATION

[75] Inventor: Satwinder Malhi, Garland, Tex.

[73] Assignee: Texas Instruments Incorporated, Dallas, Tex.

[21] Appl. No.: 69

[22] Filed: Jan. 4, 1993

[51] Int. Cl.$^5$ ............................ H01L 21/265
[52] U.S. Cl. .................... 437/33; 437/203; 437/41
[58] Field of Search ............. 437/203, 41, 913, 33; 257/330, 333

[56] References Cited

U.S. PATENT DOCUMENTS

| | | | |
|---|---|---|---|
| 4,767,722 | 8/1988 | Blanchard | 437/41 |
| 5,082,795 | 1/1992 | Temple | 437/41 |
| 5,242,845 | 9/1993 | Baba et al. | 437/40 |

Primary Examiner—George Fourson
Assistant Examiner—David M. Mason
Attorney, Agent, or Firm—Richard A. Stoltz; James C. Kesterson; Richard L. Donaldson

[57] ABSTRACT

A transistor device (10) includes an epitaxial layer (14) formed on a semiconductor substrate layer (12). A base layer (16) is formed on the epitaxial layer (14) and a source layer (18) is formed on the base layer (16). A trench region (22) is formed extending through the source layer (18), the base layer (16), and the epitaxial layer (14) and into the semiconductor substrate layer (12). An oxide layer (24) is formed on the source layer (18) and on the internal walls of the trench region (22) such that the oxide layer (24) is wider at the bottom of the trench region (22) than at the top in order to handle high voltage applications. A gate layer (26) is formed within the trench region (22) on the oxide layer (24). The gate layer (26) causes a drift region formed within the epitaxial layer (14) to fully deplete under full rated blocking conditions, decreasing the drift region component of the on-resistance which is the dominant parameter in very high voltage devices.

4 Claims, 3 Drawing Sheets

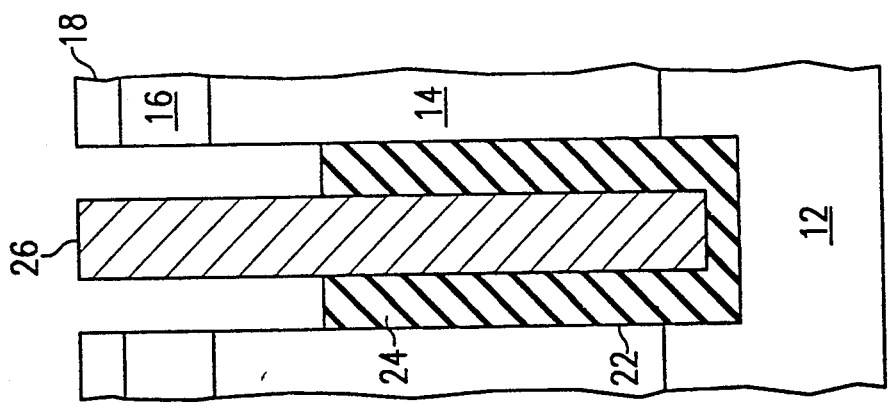
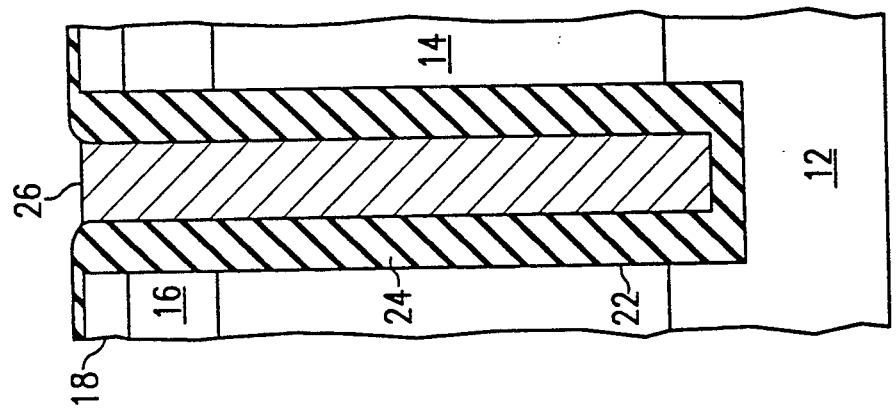
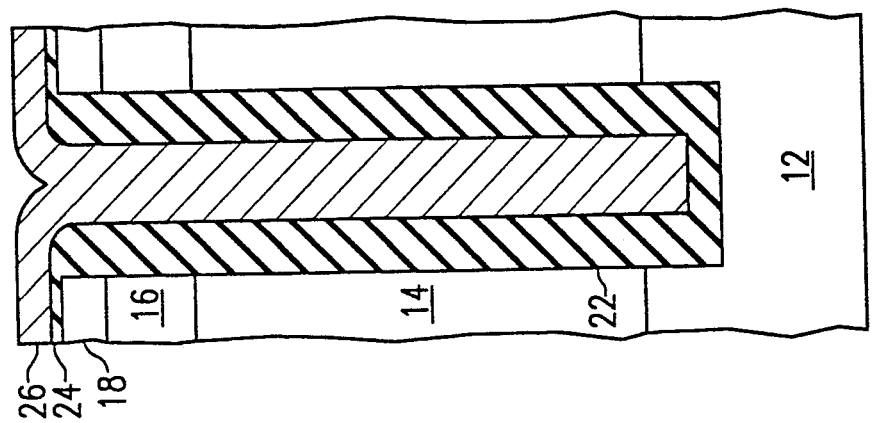
FIG. 2a
FIG. 2b
FIG. 2c

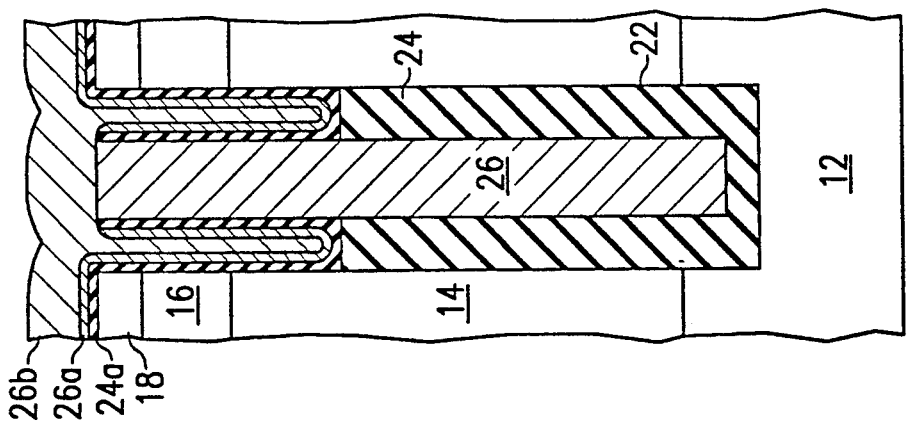
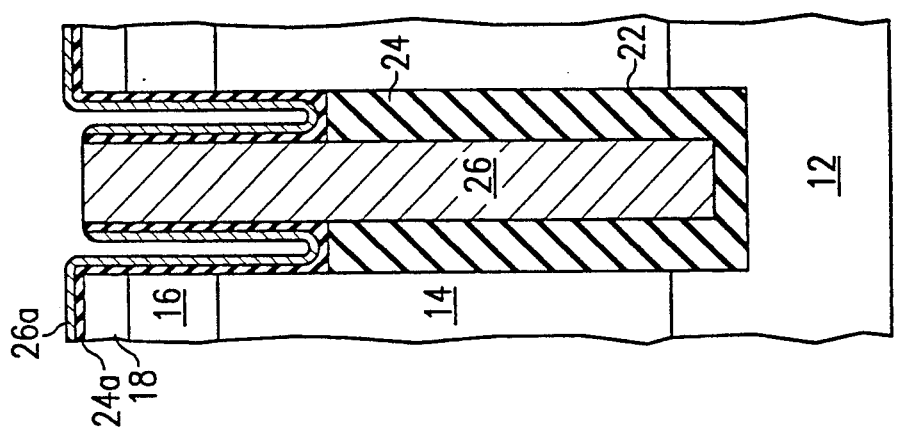
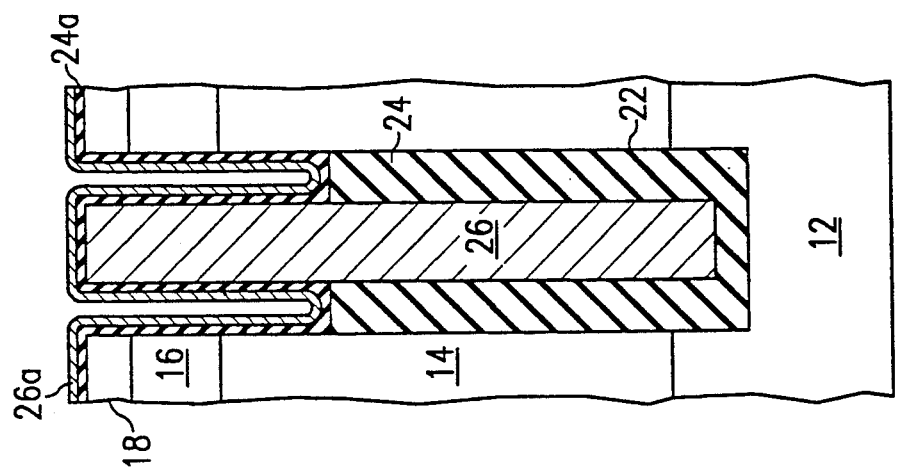

HIGH PERFORMANCE HIGH VOLTAGE VERTICAL TRANSISTOR AND METHOD OF FABRICATION

TECHNICAL FIELD OF THE INVENTION

This invention relates in general to electronic power devices and more particularly to a high performance high voltage transistor and method of fabrication.

BACKGROUND OF THE INVENTION

Many advancements have been made in the field of power integrated circuits in the development of power transistors. Lateral double diffused metal oxide semiconductor transistors (LDMOS) have been the power devices of choice for integration into very large scale integrated circuit logic processes. The on-resistance per unit area ($r_{ds}$(on)) is a figure of merit for a high voltage power device. LDMOS power transistors exhibit low on-resistance and high breakdown capability concurrently through a reduced surface field (RESURF technique) introduced by J. A. Apples and H. M. J. Vaesn "High Voltage Thin Layer Devices" (RESURF devices), *IEDM Tech. Digest*, pp. 238-241, 1979.

In integrated circuit design, semiconductor die area is a crucial factor. Generally, an increase in transistor area results in a decrease in on-resistance of the transistor. Therefore, a crucial design constraint is the trade off between transistor performance and device cost. This trade off problem has driven research into new transistor structures that provide low on-resistance while simultaneously minimizing transistor area. One proposed improvement has been the development of a trench DMOS transistor by Ueda, et al. in "An Ultra-Low On-Resistance Power MOSFET Fabricated by Using a Fully Self Aligned Process", *IEEE Transactions on Electron Devices*, Vol. ED-34, No. 4, April 1987. However, further improvements can be made to the trench DMOS transistor in order to obtain a low on-resistance and a high blocking voltage.

From the foregoing, it may be appreciated that a need has arisen for a DMOS transistor having a low on-resistance and a high blocking voltage using a trench structure.

SUMMARY OF THE INVENTION

In accordance with the present invention, a high performance high voltage transistor with low on-resistance and method of fabrication are provided which substantially eliminate or reduce disadvantages and problems associated with previous transistors of this type.

The present invention is a transistor having an epitaxial layer of a first conductivity type formed on a semiconductor layer. A base layer of a second conductivity type is formed on the epitaxial layer. A source layer of the first conductivity type is formed on the base layer such that a vertical channel forms in the base layer between the source layer and the epitaxial layer during transistor operation. A trench region extends through the source layer, the base layer, and the epitaxial layer into the semiconductor layer with an insulator layer formed on the inner walls of the trench region and on the source layer. A gate layer is formed within the trench region that extends into the semiconductor layer. The gate layer is substantially wider at the top of the trench region than at the bottom of the trench region. The insulator layer separates the gate layer from the semiconductor layer and is substantially thicker at the bottom of the trench region than at the top of the trench region.

In alternative embodiments, a vertical region of the first conductivity type extends through the base layer to the epitaxial layer along a wall of the trench region. The source layer is formed within the base layer such that the base layer separates the vertical region from the source layer, forming a lateral MOSFET channel between the vertical region and the source layer.

The device and method of the present invention provide for various technical advantages. For example, one technical advantage is to provide a high performance transistor with high blocking voltage and low on-resistance. Another technical advantage is to provide a transistor with low on-resistance and high blocking voltage while minimizing transistor area. Other technical advantages are readily apparent to one skilled in the art from the following descriptions, figures, and claims.

BRIEF DESCRIPTION OF THE DRAWINGS

For a more complete understanding of the present invention and the advantages thereof, reference is now made to the following description taken in conjunction with accompanying drawings, wherein like reference numerals represent like parts, in which:

FIGS. 2a-f illustrate highly magnified schematic sectional views of the fabrication of the trench region.

DETAILED DESCRIPTION OF THE INVENTION

Figure 1:
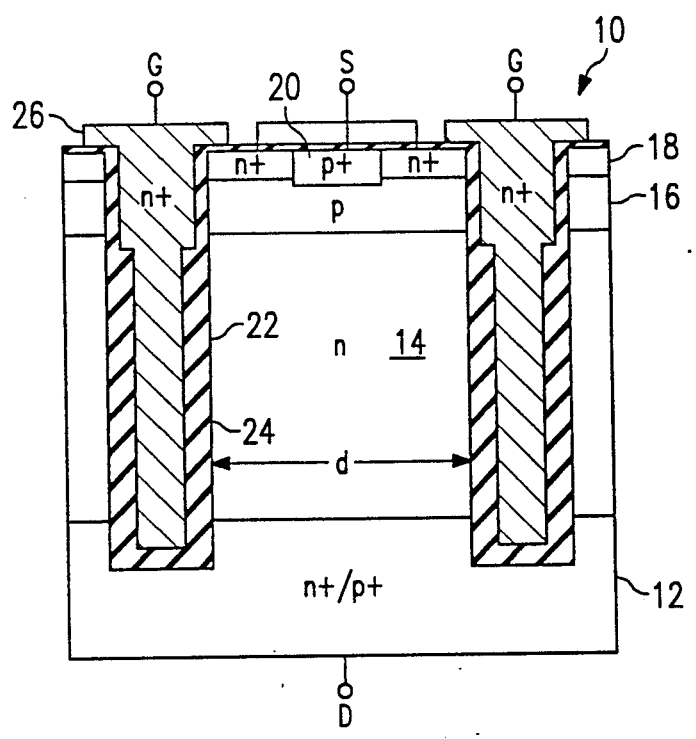
FIG. 1 illustrates a highly magnified schematic sectional view of a preferred trench design transistor.

FIG. 1 is a highly magnified schematic sectional view of a transistor 10 according to the present invention. Transistor 10 includes a semiconductor substrate layer 12 having either an (N+) dopant for a DMOS transistor design or a (P+) dopant for an insulated gate bipolar transistor design. An epitaxial layer 14 having an (N) dopant is grown, diffused, or deposited onto semiconductor layer 12 to form a drift region for device 10. A base layer 16 having a (P) dopant is grown, diffused, or deposited onto epitaxial layer 14. A source layer 18 having an (N+) dopant is grown, diffused, or deposited onto base layer 16. An additional body contact region 20 having a (P+) dopant is diffused through source layer 18 to base layer 16 to define the source for transistor 10.

A trench 22 is formed within device 10 extending through source layer 18, base layer 16, and epitaxial layer 14 and into semiconductor layer 12. An oxide layer 24 is grown or deposited on source layer 18 and on the inside walls of trench 22. A gate layer 26 is formed within trench 22 and extends into semiconductor layer 12. Oxide layer 24 is thicker near the bottom of the trench and becomes thinner towards the top of the trench. Conversely, gate layer 26 is narrower at the bottom of the trench and becomes wider towards the top of the trench. Metal contacts for the gate, source, and drain of device 10 are placed at gate layer 26, source layer 18 and body contact region 20, and semiconductor layer 12, respectively, for a DMOS transistor design.

Trench region 22 allows for a channel to be created between source layer 18 and epitaxial layer 14 along the outer wall of trench region 22. This vertical channel reduces the transistor area of device 10 by avoiding the lateral channel spacing occurring in previous vertical DMOS transistors. The design of device 10 also creates a spacing width "d" between trench regions that controls the blocking voltage and on-resistance of device 10. Spacing width "d" is chosen such that the trench poly field plates can fully deplete the drift region formed in epitaxial layer 14 under full rated blocking condition, leading to RESURF field distribution in this region. This depletion will allow the drift region to be more highly doped and cause this component of the on-resistance to decrease, achieving improved performance results by reducing this dominant resistance component in very high voltage devices.

Trench region 22, by extending into semiconductor substrate layer 12, allows for electrons to accumulate along the outer sidewalls of trench region 22 when gate layer 26 is positively biased. This accumulation of electrons on the sidewalls effectively reduces the drift region component of the on-resistance. The oxide layer must be thicker at the bottom of trench region 22 to withstand high drain voltage applications. A thin oxide layer at the bottom of trench region 22 cannot handle high voltages causing the thin oxide layer to break down and device 10 to malfunction.

FIGS. 2a-f are highly magnified schematic sectional views depicting a process for forming and filling trench region 22. After epitaxial layer 14, base layer 16, and source layer 18 have been conventionally grown, deposited, or diffused as appropriate onto semiconductor layer 12, trench region 22 is formed through each respective layer into semiconductor layer 12. Referring to FIG. 2a, oxide layer 24 is deposited onto base layer 18 and into trench region 22 along the inner walls of trench region 22. Gate layer 26 is deposited onto oxide layer 24, filling in trench region 22. Referring to FIG. 2b, the upper portion of gate layer 26 above source layer 18 is removed, followed by the removal of the upper portion of oxide layer 24 as depicted in FIG. 2c. Oxide layer 24 is removed to the extent that the remaining oxide layer does not extend beyond epitaxial layer 14.

As shown in FIG. 2d, a thin oxide layer 24a is deposited on source layer 18, on oxide layer 24, and along the inner walls of trench region 22. Subsequently, a thin gate layer 26a is deposited onto thin oxide layer 24a. Thin gate layer 26a provides a seal for thin oxide layer 24a and prevents contamination of thin oxide layer 24a from subsequent etching processes. As shown in FIG. 2e, thin gate layer 26a and thin oxide layer 24a are removed from gate layer 26 only. An additional gate layer 26b is deposited onto thin gate layer 26a, making contact with gate layer 26 as shown in FIG. 2f. This process provides a wider oxide layer and narrower gate layer at the bottom of trench region 22 and a narrower oxide layer and wider gate layer at the top of trench region 22.

Figure 3:
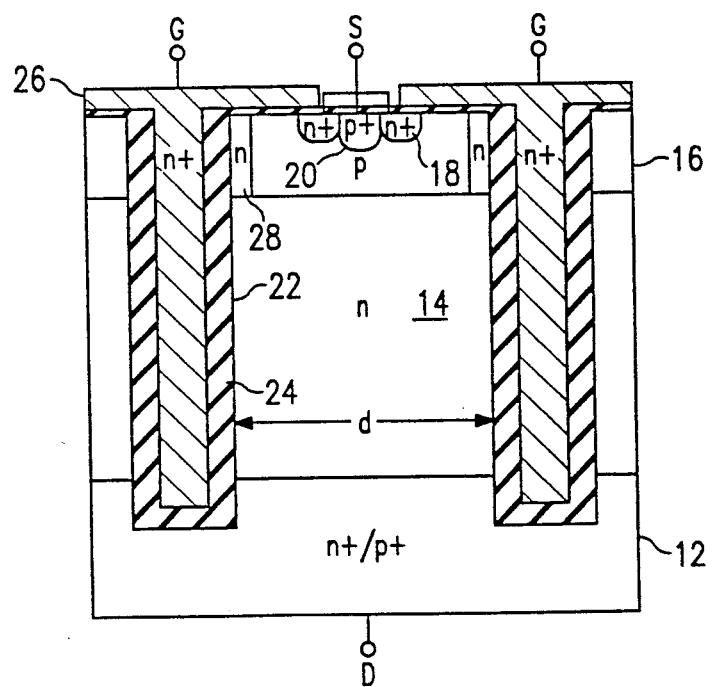
FIG. 3 illustrates a highly magnified schematic sectional view of an alternate design for the trench transistor.

FIG. 3 is a highly magnified schematic sectional view of an alternate structure for device 10. In this alternate structure, a vertical region 28 having an (N) dopant extends through base layer 16 to epitaxial layer 14. Source layer 18 is diffused into base layer 16 such that base layer 16 separates vertical region 28 from source layer 18. Body contact region 20 is diffused into source layer 18 to define the source for device 10. In this structure, a lateral channel is formed between source layers 18 and vertical region 28 within base layer 16. In this manner, a lateral channel can be formed within device 10 while maintaining spacing width "d" between consecutive trench regions 22.

Epitaxial layer 14 of device 10 has an approximate depth of 20 $\mu$m and a dopant concentration of $5 \times 10^{14}$ atoms/cm$^3$. Trench region 22 is approximately 3 $\mu$m wide and oxide layer 24 having a width of 10,000 Angstroms at the bottom of the trench and 500 Angstroms toward the top of the trench of the sidewalls. The spacing width "d" between trenches is approximately 5 $\mu$m. One skilled in the art may alter the above preferred parameters to accommodate particular needs as desired.

In summary, a transistor having reduced on-resistance is achieved by forming a trench region through a source layer, a base layer, and an epitaxial layer and into a semiconductor substrate layer. The trench region is filled with a gate layer such that the trench poly field plates can fully deplete the drift region formed by the epitaxial layer under full rated blocking conditions, leading to RESURF field distribution in the drift region. The drift region becomes more highly doped and this component of the on-resistance, the dominant component in very high voltage devices, is decreased providing significantly improved performance for the transistor. The trench characteristics of the transistor minimize transistor area by creating a vertical channel while still providing low on-resistance for the device. A lateral channel device may be constructed using trench characteristics while still maintaining a minimal transistor area.

Thus, it is apparent that there has been provided, in accordance with the present invention, a transistor device and method of fabrication that satisfies the advantages set forth above. Although the preferred embodiment has been described in detail, it should be understood that various changes, substitutions, and alterations can be made herein. For example, one skilled in the art may appreciate the particular dopants may be changed to produce slightly different transistor characteristics as the need desires. Also, the fabrication process may be altered and still achieve the same transistor device. These types of changes would still fall within the intended scope of the present invention and thus would not depart from the spirit and scope of the invention as defined by the following claims.

What is claimed is:

1. A method of fabricating a high performance high voltage transistor at a face of a semiconductor substrate, comprising the steps of:

growing an epitaxial layer of a first conductivity type on the semiconductor substrate such that a drift region forms within said epitaxial layer;

diffusing a base layer of a second conductivity type on said epitaxial layer;

diffusing a source layer of said first conductivity type on said base layer such that a channel forms within said base layer;

forming a trench region through said source layer, said base layer, and said epitaxial layer and into the semiconductor substrate;

depositing a thick oxide layer on said source layer and inner walls of said trench region;

depositing a thick gate layer of said first conductivity type on said thick oxide layer and within said trench region;

removing a portion of said thick gate layer above said source layer;

removing a portion of said thick oxide layer such that a remaining thick oxide layer does not extend beyond said epitaxial layer;

depositing a thin oxide layer onto said source layer, said thick oxide layer, said thick gate layer, and said inner walls of said trench region;

depositing a thin gate layer of said first conductivity type on said thin oxide layer;

removing said thin gate layer and said thin oxide layer from a lateral surface of said thick gate layer; and depositing a second thick gate layer of said first conductivity type on said thin gate layer and said lateral surface of said thick gate layer.

2. The method of claim 1, further comprising the step of:

forming a vertical region of said first conductivity type extending through said base layer to said epitaxial layer, said base layer separates said vertical region from said source layer such that said channel forms laterally within said base layer between said source layer and said vertical region.

3. The method of claim 1, wherein the semiconductor substrate has said first conductivity type to form a double-diffused metal oxide semiconductor transistor.

4. The method of claim 1, wherein the semiconductor substrate has said second conductivity type to form an insulated gate bipolar transistor.

* * * * *